United States Patent [19]

Davie

[11] Patent Number: 4,734,900

[45] Date of Patent: Mar. 29, 1988

[54] RESTORING AND CLOCKING PULSE WIDTH MODULATED DATA

[75] Inventor: Neil R. Davie, Tucson, Ariz.

[73] Assignee: International Business Machines Corporation, Armonk, N.Y.

[21] Appl. No.: 855,560

[22] Filed: Apr. 25, 1986

[51] Int. Cl.[4] .......................... H04N 5/76; G11B 5/09
[52] U.S. Cl. ......................................... 369/59; 360/51
[58] Field of Search ...................... 369/59; 360/44, 51, 360/46; 375/118, 119, 120, 94, 101, 81

[56] References Cited

U.S. PATENT DOCUMENTS 4,184,179  1/1980  Deming .................................. 360/44

Primary Examiner—Vincent Canney

Attorney, Agent, or Firm—Bradley A. Forrest; Homer L. Knearl

[57] ABSTRACT

Width restoring to eliminate unintended width variations in pulse width modulated data in combination with a phase lock loop allows pulse width modulated data in high density optical recordings. The width restoration is accomplished by detecting the timing relationship of the leading and trailing edges of pulses relative to expected timing for the leading and trailing edges. Expected time is derived from a phase locked loop or the original write signal. The detected timing is compared to the expected timing and the timing of the leading and trailing edge signals is corrected. Either analog or digital width correction techniques are used. Width restoration may be used while reading data or while writing the data.

17 Claims, 5 Drawing Figures

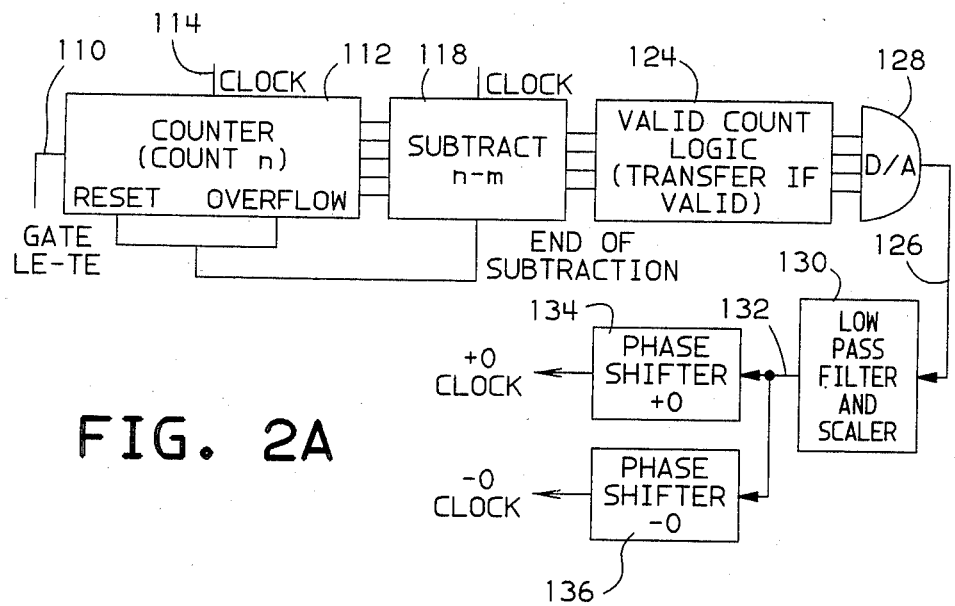
FIG. 2A
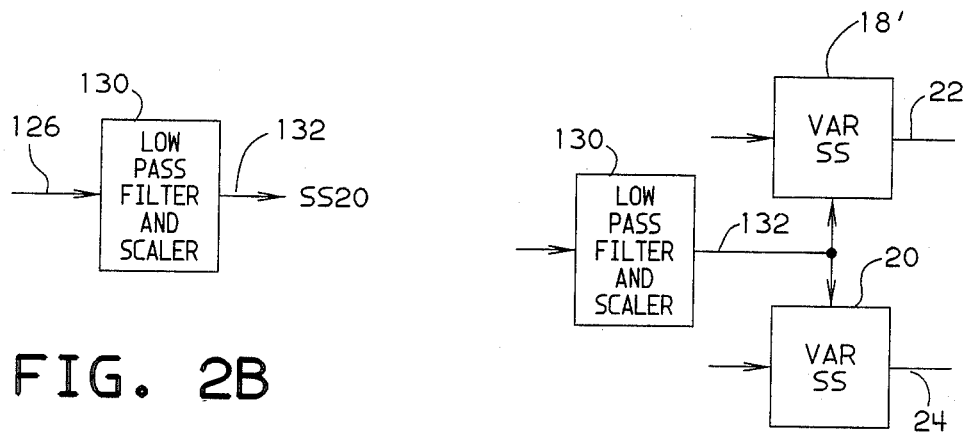
FIG. 2B
FIG. 2C

RESTORING AND CLOCKING PULSE WIDTH MODULATED DATA

BACKGROUND OF THE INVENTION

The present invention relates to restoring and clocking pulse width modulated data in a data recording channel during either writing or reading of the data.

Pulse width modulated data is a form of data where transitions in the representation of data on a storage medium correspond to a bit of data, either a "1" or a "0". No transition thus corresponds to a "0" or a "1" respectively. Since the condition of no transition carries information, it is necessary to use a clock signal to define data cell width in order to detect how many no transitions have occurred between transitions. This clock signal must be synchronized with the data-in signal, and this is usually done with a phase-lock loop. A good example is taught in U.S. Pat. No. 3,804,992 entitled "Digital Time Sampling Phase Comparator With Noise Rejection," issued to Fiorino et al.

In a typical environment, magnetic recording for example, the pulse width modulated recordings tend to be uniform, i.e. have similar precision and definition throughout a recording. The data transitions tend to shift in the same direction and in small amounts relative to the clock and thus the phase-lock loop can control a clock to track the time shifts of the data-in signal.

In optical storage systems, many factors lead to variations in the size of the representation of data in a single recording whether the representation is the leading and trailing edges of a pit which reflects light, or the size of the area of changed magnetic or opto-magnetic properties. As a result, the transitions in pulse width modulated data may move a significant amount due to recording properties. This recording shift has nothing to do with the information content of the data.

The recording shift of the leading and trailing edge data transitions is in opposite directions. In effect the pulse width has changed due to variations in recording phenomenon rather than due to changes in timing or information. These unintended pulse width variations make it difficult for the phase-lock loop to correctly synchronize the clock to the data and thus align timing windows, i.e. data cells, used in a recording channel to decode the data from the transitions.

Some of the potential factors causing the leading and trailing edges to shift significantly in opposite directions are variable laser power, focus error, tracking error, media composition, laser dwell time and media sensitivity. Variations in these factors lead to timing variations in both the leading edge of the pit or mark and the trailing edge of the pit. If laser power is too great, or the media is slightly more sensitive than expected, the leading edge of the pit may be encountered sooner than expected because the pit is larger than desired. Under the same condition of the media, the trailing edge of the pit may be encountered later than expected, thus leading to timing difficulties in detection of both the leading and trailing edges. Merely moving the timing windows (data cells) one direction or the other by adjusting the clock in the phase lock loop can not compensate for these unintended pulse width variations and can lead to a larger number of errors in detecting the data.

SUMMARY

In accordance with this invention, the leading and trailing edge transitions in the data signal are monitored to detect variations in the expected pulse width. Once the pulse width variations are detected, the pulse width is restored to an expected pulse width. This width restoration is integrated into a phase locked loop that follows the concurrent phase shifts in both edges of the data signal. As a result this width-restoring phase locked loop will generate correct data and clock signals for use by the data decoding circuits in the recording channel.

To accomplish the restoring function, a phase locked loop is used to establish the expected positions for the leading and trailing edge transitions of the pulse. With these expected transitions defined, phase differential logic detects variations of the actual pulse width from the expected pulse width. Feedback of this variation information is used to adjust the position of the leading and trailing edge signals to restore the pulse width to the expected pulse width.

In one preferred embodiment, a first single shot multivibrator is triggered on the leading edge of a pulse, and a second single shot multivibrator is triggered on the trailing edge of a pulse. A width error is generated as the summation of alternate speed-up and slow-down signals from a conventional phase-locked loop used in data detection. The error signal is then used to vary the timing of one of the single shots operating on the leading or trailing edge of the pulse to define the pulse edges in the phase lock loop.

In a further preferred embodiment, leading and trailing edge transitions are supplied to a counter which counts clock pulses between leading and trailing edge transitions. The number of expected pulses is subtracted from the actual number of pulses counted. This value is filtered by a low pass filter to average the value over several leading to trailing edge transitions. The filtered value is then supplied to a single shot as in the above embodiment or supplied to plus and a minus phase shifters which provides phase shifts for use by separate leading and trailing edge data recovery clocks.

In yet a further preferred embodiment, data is effectively restored as it is written. Using a read while write technique to detect recording shift of data being written on the media, the phase of the data being written is intentionally shifted in the opposite direction of detected recording shift. Thus, when data is read, it will appear not to be shifted. This preshifting is accomplished by detecting the leading edges and trailing edges of the data while it is being written, and comparing them to the timing of the actual data before it is written. The preshifting is then performed as a function of that comparison.

Pre-restoration of the width of data leads to greater precision in the positioning of leading and trailing edges of data representations on recording media. The physical density of such edges on the media may then be increased because of associated timing tolerance reduction. When coupled with the improvement in reading reliability given by width restoring data while reading, linear bit densities realizable are almost double that of conventional representation of bits by pits or spots.

BRIEF DESCRIPTION OF THE DRAWINGS

FIG. 2A is a detailed block diagram of an alternate circuit for generating the width correction signals in accordance with the present invention, FIGS. 2B and 2C are detailed block diagrams indicating how width correction signals generated by the circuits in FIG. 2A could be connected to and used in the circuits of FIG. 1.

DETAILED DESCRIPTION.

Figure 1:
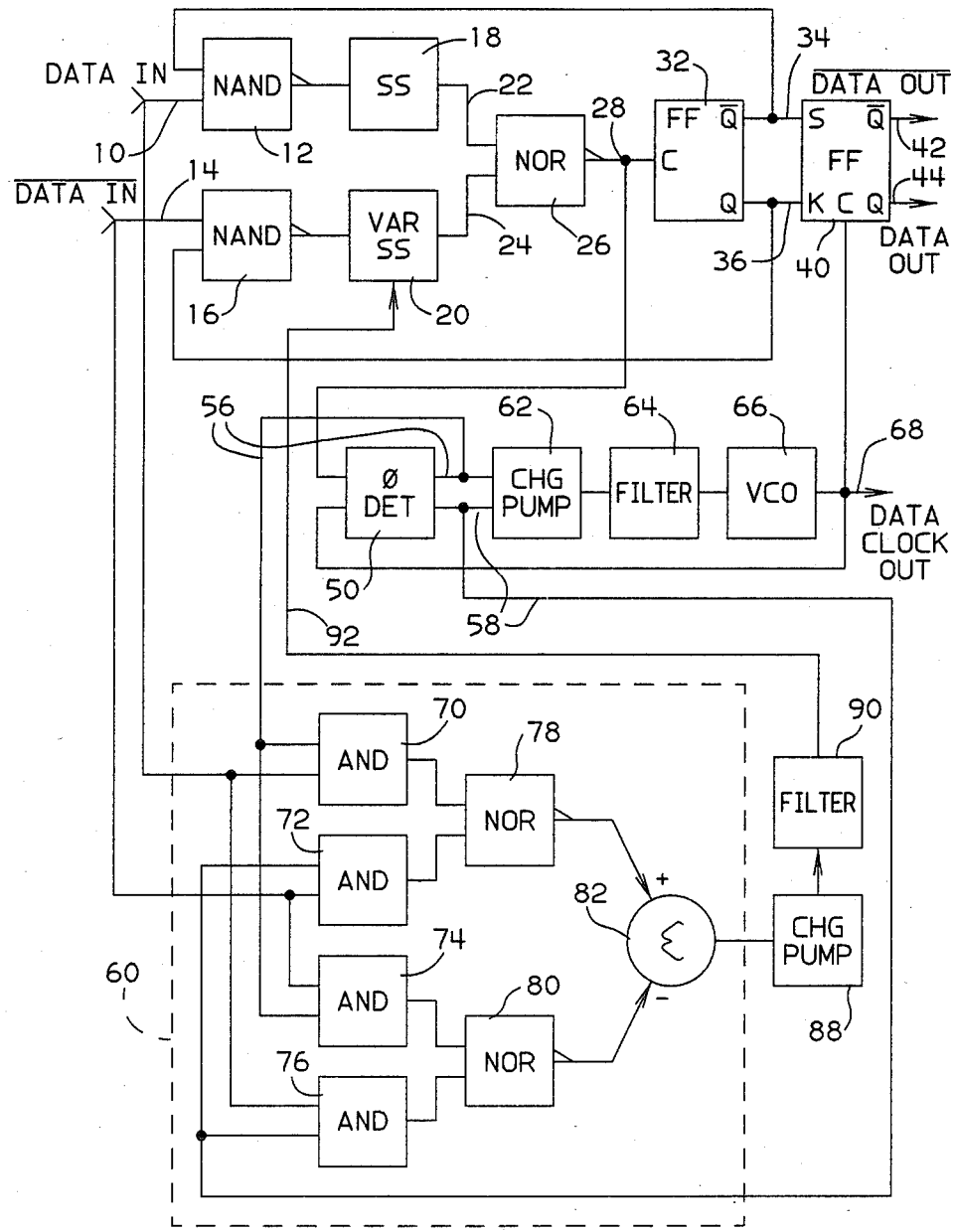
FIG. 1 is a detailed block diagram of a phase locked loop with width restoration in accordance with the present invention.

In FIG. 1, data read from a pulse width modulated recorded signal on a recording media is provided on line 10 to NAND gate 12. The inverse of the data is also provided on line 14 to NAND gate 16. NAND's 12 and 16 are enabled to pass the data signals by flip flop 32. Thus only one NAND is enabled at a time; NAND 12 is enabled to pass the leading edge and NAND 16 is enabled to pass the trailing edge.

The NAND gates 12 and 16 are coupled to single shots 18 and 20 respectively. The trailing edge of the signal from the single shots is passed by NOR 28 to trigger flip flop 32. In effect the single shots delay both the leading and trailing edge signals before those signals trigger the flip flop. Further since single shot 20 is variable in the duration of its pulse, the timing between the leading and trailing edges may be adjusted. This function will be used as explained later to make the width restoration.

The complimentary outputs on lines 34 and 36 of flip-flop 32 are provided to a second output flip flop 40. This flip flop provides complimentary data out signals on lines 42 and 44 and is triggered by the data clock out signal to receive the contents from flip flop 32. The data clock out signal is generated by the phase locked loop which will now be described.

The output 28 of NOR 26 is also provided to a phase detector 50 which compares the phase timing differences of data on input line 28 and timing signals from a timing clock signal on line 68 from voltage controlled oscillator (VCO 66). Phase detector 50 provides a speed-up signal on line 56 and a slow-down signal on line 58 to a charge pump 62. The charge pump passes more or less current to filter 64 in accordance with the speed-up or slow-down signals respectively. Filter 64 accumulates and averages the speed up and slow down signals; it contains a capacitor to convert the current to a voltage. The voltage out of filter 64 controls the frequency of the signal from VCO 66.

This configuration of elements 50, 62, 64 and 66 is well known as a charge-pump phase locked loop. The loop is a reference means generating a data clock signal 68 to track concurrent time shifts by the leading and trailing edge transitions in the data signal. Data clock out on line 68 provides a trigger for flip flop 40. The data out signals and the data clock signal are used by decoding circuits (not shown) to convert the pulse width modulated data out signal into binary data.

To accomplish width restoration, the speed up and slow down signals on lines 56 and 58, respectively, are passed to a differential phase detector 60. The function of this detector is to measure the amount of recording shift of the actual leading and trailing edge timing from the expected leading and trailing edge timing as established by the phase locked loop. As explained earlier recording shift will cause the edges to move in opposite directions relative to the expected edge positions. In effect the differential phase detector 60 is detecting unintended width variations in the pulse width modulated data.

Data-in line 10, and its complement on line 14 in conjunction with the AND and NOR gates alternate the polarity sense of the speed up and slow down signals to the summing junction 82. For each speed up and slow down pulse, the polarity is controlled by whether the data indicates it was due to a leading or trailing edge. The difference of each, then is indicative of the amount of recording shift between actual leading and trailing edge and expected leading and trailing edge.

Viewed as detection of pulse width variation AND's 70 and 72 with NOR 78 will pass the speed up and slow down pulses to difference amplifier 82 when the pulse is wider than expected. AND's 74 and 76 with NOR 80 do the same thing when the pulse is narrower than expected. Since the difference amplifier receives the speed up and slow down signals serially there is no difference function. Amplifier 82 acts to pass signals from NOR 78 and to invert and pass signals form NOR 80. The duration of the speed up and slow down signals control the duration of current flow from the charge pump 88 to the filter 90. In effect the duration of the speed up and slow down signals for a number of leading and trailing edges is summed and averaged by filter 90 to produce a signal that is a measure of the unintended width variation in the recorded pulses.

Single shots 18 and 20 nominally are adjusted to ½ clock cell time (½ the difference in time between consecutive data clock out pulses) for proper phase comparison by phase detector 50. Low pass filter 90 provides a control voltage on a line 92 to single shot 20. The control voltage effectively controls the timing of single shot 20 in response to the compliment of the data-in signal on line 14 provided through NAND gate 16. In other words, the phase locked loop keeps the leading edge in proper phase with the data clock out signal and the width correction signal from filter 90 to single shot 20 causes the single shot to move the trailing edge signal into proper phase relationship with the data clock. This controls pulse width—the timing between signals for leading and trailing edges on lines 34 and 36 during which the data clock out signal on line 68 strobes the clear input of flip flop 40 to provide the data out signals on lines 42 and 44.

A further preferred embodiment of a width restoration circuit is shown in FIG. 2A. Signals chronologically representative of detected leading edges and trailing edges of pulses from data recorded in pulse width modulated form are provided on a line 110 to a counter 112. A clock signal on line 114 provides a signal to be counted by counter 112. Counter 112 counts the number of clock pulses received between successive leading and trailing edges. The count of clock pulses, n, is provided to a subtract circuit 118, which subtracts an expected number of clock pulses, m, from the actual count, n. Subtract circuit 118 supplies the n-m count or value to a valid count logic circuit 124. The valid count logic circuit 124 ensures that only leading to trailing edge counts of minimum duration are measured, such as result from a data stream corresponding to consecutive transitions.

The n-m count is converted to an analog error signal representative of the difference in size of a spot or pit on a medium on line 126 by a digital to analog converter 128. The error signal on line 126 is provided to a low pass filter and scaler 130, which is designed with a frequency response representative of the causes of variable spot size. In general, if the transition rate is "x" transitions per second then the frequency response should be limited to less than or equal to x divided by 50 transitions per second to insure an adequate number of samples. A faster technique comprises increasing the counting logic to sample more than just the shortest leading to trailing edge time, and then using these multiple times to derive an error signal with a higher sampling rate.

The output of the filter 130 is a measure of the width variation of the actual edges from the expected edges. This signal on line 132 is applied to a double phase locked loop arrangement. The phase locked loops are referred to as a plus phase shifter 134 and a minus phase shifter 136. These phase shifters then provide phase shifts for independent clocks in their loops. These clocks are used to detect the leading and trailing edges of pulses respectively.

Alternatively in FIG. 2B, the signal on line 132 could be provided to single shot 20 in FIG. 1 to correct for width variations in the same manner as the signal from filter 90 (FIG. 1) was provided to single shot 20 to correct for width variations.

In yet another implementation, both single shots 18 and 20 in FIG. 1 could be variable as shown in FIG. 2C. The width variation could be divided in two by the scaler in filter and scaler 130. The half correction signal is then applied to variable single shots 18' and 20. Variable single shot 18' is substituted for fixed single shot 18 in FIG. 1.

Figure 3:
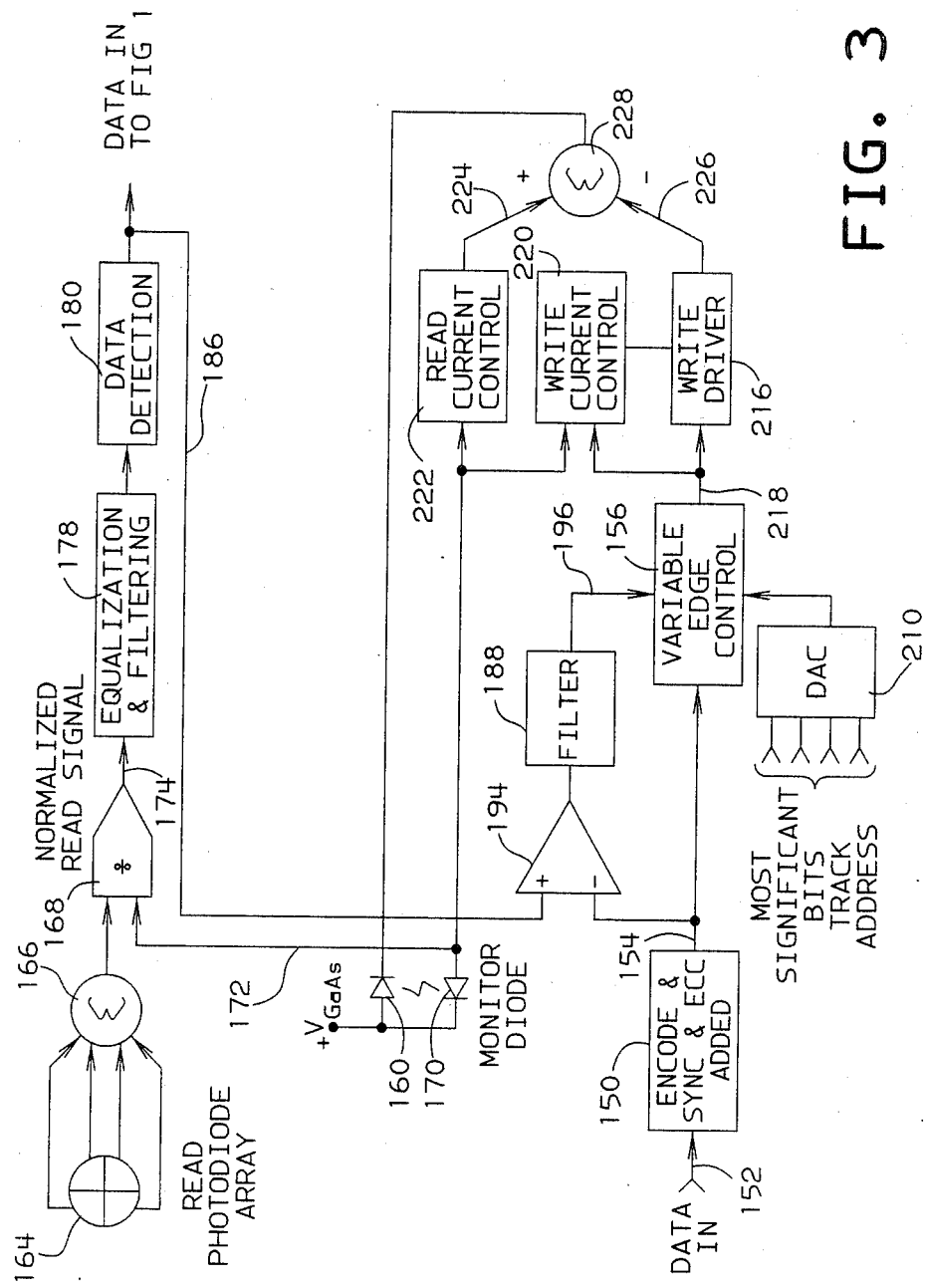
FIG. 3 is a detailed block diagram of a read while write circuit for reading data while it is written and providing feedback to minimize recording shift resulting from writing the data.

The circuits of FIG. 1 and FIG. 2A provide for width restoration of data already written, preferably by laser, in pulse width modulated form. The concept of predistortion is employed in the circuit of FIG. 3 to correct the width of actual pulses as they are written on the media.

The data to be written is provided to a data signal source 150 on a line 152. The data signal source is a reference means providing a write signal having the correct timing for ideal data detection. Data signal source 150 provides encoding, synchronization and error correction coding to generate a write signal on a line 154 to a variable edge control block 156. Edge control block 156 changes or predistorts the pulse width, the timing relationship between leading and trailing edges of the write signal data. When writing data on an optical recording medium the pulse width of the write signal controls the laser dwell time, the length of time the laser is at a current level to write a pit in the medium.

Edge control 156 changes the pulse width as a function of nonlinearities in the optical recording process. Control 156 comprises a voltage variable single shot and an AND gate. The AND gate receives the write signal and the output of the single shot. The single shot receives the write signal and the duration of the single shot output pulse is controlled by the signals from filter 188 and DAC 210 whose functions will be described hereinafter. In operation, the single shot conditions the AND gate so that it has an output pulse with one edge of the pulse corresponding to one coincident with one edge of the data pulse and with the other edge lengthened or shortened by the single shot duration relative to the other edge of the data pulse. In other words, the edge control 156 consists of timing logic that will lengthen or shorten the write signal data pulse. Ideally, the predistortion to the data is such that after writing and readback, the detected signal from the media contains the timing existing prior to the predistortion.

As data is written on a medium by a radiant energy beam generator such as GaAs laser 160, a photodiode array 164 detects the reflected light from the media and provides a readback signal summed by junction 166 to a divider 168. Divider 168 also receives a measure of laser intensity from a monitor diode 170 on a line 172. The division of the readback signal by the measure of laser intensity from the monitor diode provides a normalized read signal on a line 174 as taught in a patent application entitled "SYSTEM FOR PREVENTING THE OVERWRITING OF PREVIOUSLY OPTICALLY RECORDED DATA AND FOR READING OPTICALLY RECORDED DATA DURING WRITING", Ser. No. 672,559, filed 11/19/84 which is assigned to the same assignee as the present application. The normalized read signal is processed by equalizstion and filtering circuitry 178 and data detection circuitry 180. The data signal from data detection 180 is the conventional data-in signal as used in FIG. 1.

The write data signal on line 154 is subtracted from the read data signal on line 186 by difference amplifier 194. The write signal and the read signal are binary signals having the same amplitude. Thus the difference between them is a measure of the difference in their widths. The differences are accumulated by filter 188 which generates a voltage indicative of the average variation between edge signals in the read data and edge signals in the write data. The filter 188 is a low pass filter for the purpose of smoothing out the error signals. The filter response is chosen for the resultant transient response of the read signal control loop to react to recording shift changes such as from mis-focus transients and recording media variations. Thus, filter 188 provides a pulse width or edge correction signal representative of the comparison of the write data and detected read signal.

The edge correction signal on line 196 is connected to the voltage variable single shot in edge control 156. The edge correction voltage controls the timing of single shot 156 to change the width of the pulse signal to write driver 216. In other words, the edge control shifts the leading and trailing edges relative to each other to predistort the write signal on line 218 relative to the signal on line 154. However, as a result of this predistortion, the read signal on line 186 will closely match the write signal on line 154.

Write data predistortion is also provided as a function of track radius. Because the medium usually rotates at a constant velocity, the surface velocity of the laser spot varies as a function of its distance from the center of rotation of the medium. A digital to analog converter 210 provides a control voltage to the variable single shot in edge control 156 to adjust the pulse width as a function of track location represented by the most significant bits of its address.

The actual dwell time of the laser 160 (time during which write current is on) is controlled by a write driver 216 which receives the signal from edge control 156 on line 218. The write current control circuit 220 provides the write current to the write driver current switch 216. Feedback control to the write current control circuit 220 is achieved by sensing output from the monitor diode 170.

The monitor diode output on line 172 is also provided to a read current control block 222 which provides an output on a line 224 along with the output of write driver 216 on a line 226 to a summing node 228 to control the current flowing to laser 160 during write. The constant current from the read control 222 provides laser current for normal read operations, typically 2 milliwatt power from the laser. During write, the write driver switch 216 directs the additional current from the write current control through the laser for higher power required to melt a pit into the media.

Data edge restoration and clocking can be performed on the read data signal on line 186 by the circuits in FIGS. 1 or 2. While the width restoration during write removes much of the previous unintended variations in written data, the restoration circuit used again while reading data still provides even higher reliability because it centers the transitions in the data cells or detection windows (as provided by data clock out on line 68 in FIG. 1).

Pre-restoration of data leads to greater precision in the positioning of leading and trailing edges of data representations on recording media. The physical density of such edges on the media may then be increased because of associated timing tolerance reduction. When coupled with the improvement in reading reliability given by width restoring data while reading, linear bit densities realizable are almost double that of conventional representation of bits by pits or spots.

While the invention has been described in terms of preferred embodiments, it will be recognized by those skilled in the art that further embodiments are within the scope of the invention as defined by the claims. All forms of data representations, be it burned pits, optomagnetic or other less known forms can take advantage of the deskewing of signals taught herein.

I claim:

1. A method for clocking pulse width modulated data wherein data is represented by the timing of leading and trailing edges of pulses, the method comprising the steps of:
   detecting the leading edges of data pulses;
   detecting the trailing edges of data pulses;
   providing signals representative of the detected leading and trailing edges;
   generating a clock signal in response to the leading and trailing edge signals, said clock signal following the shifts of said edge signals, that occur in the same direction, in order to provide an expected time for the detection of said edges;
   comparing the timing of the signals representative of said edges with the expected time and generating a width correction signal representative of unintended width variations in the data pulses as manifested by shifts of the leading and trailing edges in opposite directions relative to the expected time provided by said clock signal; and
   shifting the relative timing between leading and trailing edge signals in response to the width correction signal to restore the width of the data pulses to the expected width between the leading and trailing edge signals.

2. The method of claim 1 wherein said providing step further comprises the steps of:
   providing a set of leading edge signals;
   providing a set of trailing edge signals.

3. The method of claim 2 wherein said clock generating step further comprises the steps of:
   detecting the phase difference between the clock signal and the leading and trailing edge signals;
   speeding up or slowing down the clock signal in response to the phase difference between the clock signal and the leading and trailing edge signals.

4. The method of claim 3 wherein said comparing step comprises:
   detecting a first phase difference between the leading edge signals and the clock signal;
   detecting a second phase difference between the trailing edge signals and the clock signal;
   combining the first and second phase differences to generate the width correction signal.

5. The method of claim 4 wherein said shifting step comprises:
   delaying the trailing edge signals relative to the leading edge signals;
   adjusting the delay in the previous step in response to the width correction signal.

6. The method of claim 4 wherein said combining step further comprises the step of:
   averaging the first and second phase differences over several leading and trailing edge detections.

7. In optical recording apparatus having a beam generator for generating a radiant energy beam for reading and writing pulse width modulated data on a storage medium, apparatus for correcting width distortions in the optical recorded data, said apparatus comprising:
   means for detecting the data recorded on the storage medium and generating a read signal indicating the pulse width modulated data recorded on the storage medium;
   a data signal source for providing a write signal indicative of the pulse width modulated data to be written on the storage medium;
   means for comparing the same pulse in the read signal and write signals, while the data is being written on the medium, and generating a width correction signal;
   control means in response to the width correction signal for controlling the width of the pulse in the write signal to provide a width corrected write signal;
   means for driving said beam generating means in response to the corrected write signal to write the pulse with a width so that the width of the read signal pulse is close to the width of the write signal pulse irrespective of recording phenomenon distortions.

8. The apparatus of claim 7 wherein:
   said detecting means generates a read signal indicating the leading and trailing edges of the data pulses;
   said comparing means takes the difference between the read signal and write signal indicating the difference in timing between the leading and trailing edges of the same pulse in the two signals.

9. The apparatus of claim 7 and in addition:
   means for averaging the differences in pulse width between the same pulses in the write and read signals in order to generate the width correction signal.

10. The apparatus of claim 9 wherein:
    said control means shifts one edge of the pulse being corrected to restore the width of the pulse in the read signal to the width of the pulse in the write signal.

11. The apparatus of claim 10 wherein said beam generating means is a laser and the dwell time of the laser is controlled by said control means.

12. Apparatus for restoring pulse width modulated data wherein data is represented by leading and trailing edges of pulses, the circuit comprising:

first detection means for detecting the leading edges of data pulses;

second detection means for detecting the trailing edges of data pulses;

reference means for providing an indication of expected timing for detection of the edges;

compare means coupled to the first and second detection means and to the reference means for comparing the detections of the leading and trailing edges with the indication of expected timing; and timing means coupled to the compare means for restoring the leading and trailing edges to their expected timing.

13. The apparatus of claim 12 wherein said compare means comprise:

means for measuring the time difference between the leading edge pulse transitions and their expected timing; and means for measuring the time difference between the trailing edge pulse transitions and their expected timing; and means for accumulating these differences to provide an edge correction signal.

14. The apparatus of claim 13 wherein said timing means is responsive to the edge correction signal to shift the timing of the leading or trailing edge relative to each other.

15. The apparatus of claim 12 and further comprising:

writing means coupled to the timing means for writing the data pulses with leading and trailing edge separation controlled by the edge correction signal.

16. The apparatus of claim 15 wherein said reference means provides the data pulse write signal as the indication of expected timing.

17. The apparatus of claim 14 wherein said reference means comprises:

phase lock clocking means for providing as the expected timing a clock signal that tracks variations in the timing of leading and trailing edge transitions shifting in the same direction.

* * * * *